United States Patent
Ikenaga et al.

(10) Patent No.: US 6,882,048 B2
(45) Date of Patent: Apr. 19, 2005

(54) LEAD FRAME AND SEMICONDUCTOR PACKAGE HAVING A GROOVE FORMED IN THE RESPECTIVE TERMINALS FOR LIMITING A PLATING AREA

(75) Inventors: Chikao Ikenaga, Tokyo (JP); Kouji Tomita, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/103,664

(22) Filed: Mar. 21, 2002

(65) Prior Publication Data

US 2002/0149090 A1 Oct. 17, 2002

(30) Foreign Application Priority Data

Mar. 30, 2001 (JP) ........................................ 2001-098420

(51) Int. Cl.[7] ...................... H01L 23/495; H01L 23/48; H01L 23/52; H01L 29/40
(52) U.S. Cl. ...................... 257/736; 257/735; 257/692; 257/690; 257/677; 257/674; 257/666
(58) Field of Search ................................ 257/684, 786, 257/787, 666, 667, 676, 672, 674, 677, 690, 692, 735, 736

(56) References Cited

U.S. PATENT DOCUMENTS

| | | | | |
|---|---|---|---|---|
| 3,550,261 A | * | 12/1970 | Schroeder | 438/461 |
| 3,639,811 A | * | 2/1972 | Schroeder | 257/736 |
| 5,349,238 A | * | 9/1994 | Ohsawa et al. | 257/736 |
| 6,081,029 A | * | 6/2000 | Yamaguchi | 257/666 |
| 6,201,292 B1 | * | 3/2001 | Yagi et al. | 257/666 |
| 6,208,020 B1 | * | 3/2001 | Minamio et al. | 257/675 |
| 6,400,004 B1 | * | 6/2002 | Fan et al. | 257/666 |
| 6,538,336 B1 | * | 3/2003 | Secker et al. | 257/786 |
| 2002/0031869 A1 | * | 3/2002 | Minamio et al. | 438/127 |
| 2002/0084518 A1 | * | 7/2002 | Hasebe et al. | 257/676 |
| 2002/0117740 A1 | * | 8/2002 | Jang et al. | 257/677 |
| 2003/0137032 A1 | * | 7/2003 | Abbott | 257/666 |
| 2004/0046240 A1 | * | 3/2004 | Hasebe et al. | 257/678 |

FOREIGN PATENT DOCUMENTS

| | | | | |
|---|---|---|---|---|
| JP | 2001077263 A | * | 3/2001 | H01L/23/50 |
| WO | WO 9900826 A2 | * | 1/1999 | |

* cited by examiner

Primary Examiner—Nathan J. Flynn
Assistant Examiner—Victor A. Mandala, Jr.
(74) Attorney, Agent, or Firm—Flynn, Thiel, Boutell & Tanis, P.C.

(57) ABSTRACT

A lead frame used for the production of a semiconductor package, wherein each of terminals of the lead frame to be wire-bonded to electrodes provided on the top surface of the semiconductor device has one or two groove(s) for limiting a plating area of noble metal. Since grooves are provided in each terminal, the accuracy of the plating area can be easily checked visually. Further, the grooves absorb stress applied to the terminal when the molded semiconductor packages are individually separated from each other by punching or dicing, and the situation where molding compound comes off of the terminal is prevented. In addition, since the grooves absorb vibrational stress applied to the terminal after mounting a semiconductor on the printed circuit board, the reliability of assembly is improved.

13 Claims, 7 Drawing Sheets

LEAD FRAME AND SEMICONDUCTOR PACKAGE HAVING A GROOVE FORMED IN THE RESPECTIVE TERMINALS FOR LIMITING A PLATING AREA

BACKGROUND OF THE INVENTION

1. Field of the Invention

The present invention relates to a lead frame for a semiconductor package and a semiconductor package in which the semiconductor device is mounted on a lead frame and the outside thereof, particularly, the top surface of the semiconductor device, is encapsulated with molding compound.

2. Description of the Related Art

In recent years, it has been required to miniaturize and shape a semiconductor product mounted on a substrate so as to be thinner, as the packaging of the semiconductor is made more dense. It has been required for LSI to reduce the number of chips by improving integration level and to miniaturize and make a package lighter. The popularization of so-called CSP (Chip Size Package) is rapidly advancing. Particularly, in the development of thin semiconductor products with lead frames, the semiconductor package of the single side encapsulation type has been developed in which a semiconductor device is mounted on a lead frame and the surface of the semiconductor device is encapsulated with molding compound.

Figure 1:
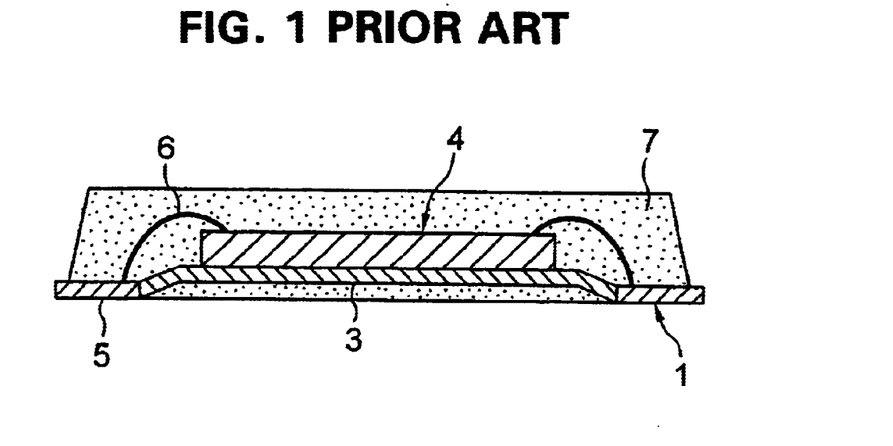
FIG. 1 is a sectional view of one example of a conventional semiconductor package.
Figure 2:
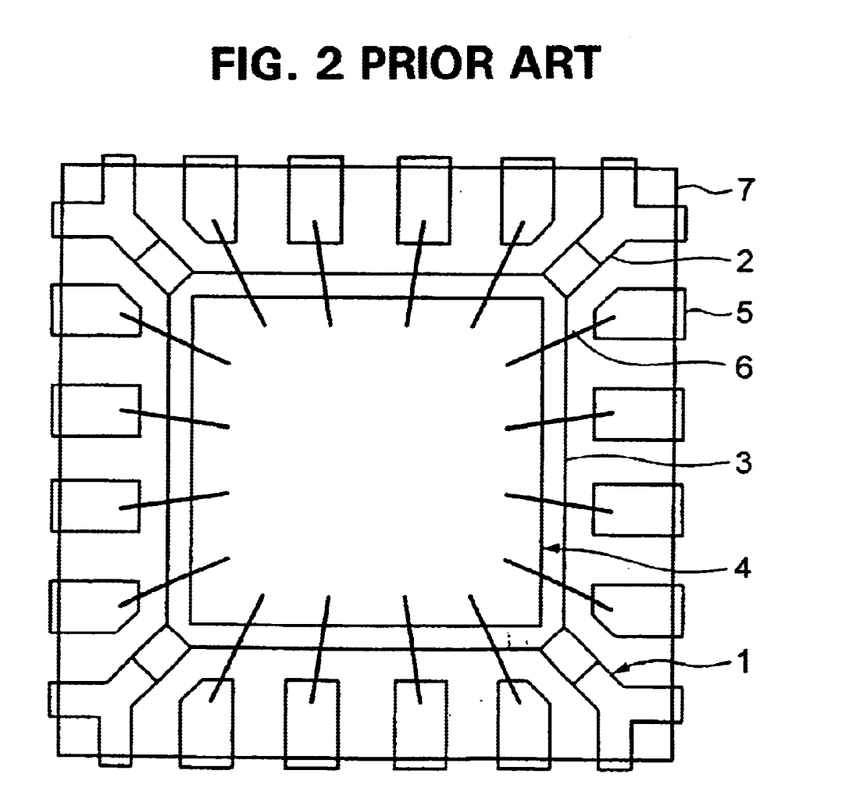
FIG. 2 is a plan view of the semiconductor package shown in FIG. 1, as seen through molding compound.

FIG. 1 is a sectional view of one example of a semiconductor package. FIG. 2 is a plan view thereof seen through molding compound. The semiconductor package shown in FIGS. 1 and 2 is comprised of a lead frame 1, a semiconductor device 4 mounted on die-pad 3 supported with suspending leads 2 of lead frame 1, metallic thin wires 6 electrically connecting electrodes provided on the top face of the semiconductor device 4 with terminals of lead frame 1, and molding compound 7 for encapsulating the outside region of semiconductor device 4 including the upper side of semiconductor device 4 and the lower side of die-pad 3. The semiconductor package is of the so-called non-lead type of semiconductor package in which outer leads do not project from the semiconductor package and the inner leads and outer leads are integrated into terminals 5, wherein in lead frame 1, suspending leads 2 are directed upward in such a manner that die-pad 3 is positioned higher than terminals 5. Since such a step is provided between die-pad 3 and terminals 5, molding compound 7 can be inserted into the lower side of die-pad 3.

Since a semiconductor device is miniature, a matrix type frame is mainly used for the above-mentioned non-lead type of semiconductor package, in which plural semiconductor devices are arranged in a direction of a width of the matrix type frame. Further, recently, due to a demand for lower costs, it is thought to switch over from a frame of the individually molded type shown in FIG. 3 to a frame of the collectively molded type shown in FIG. 4.

Figure 3A:
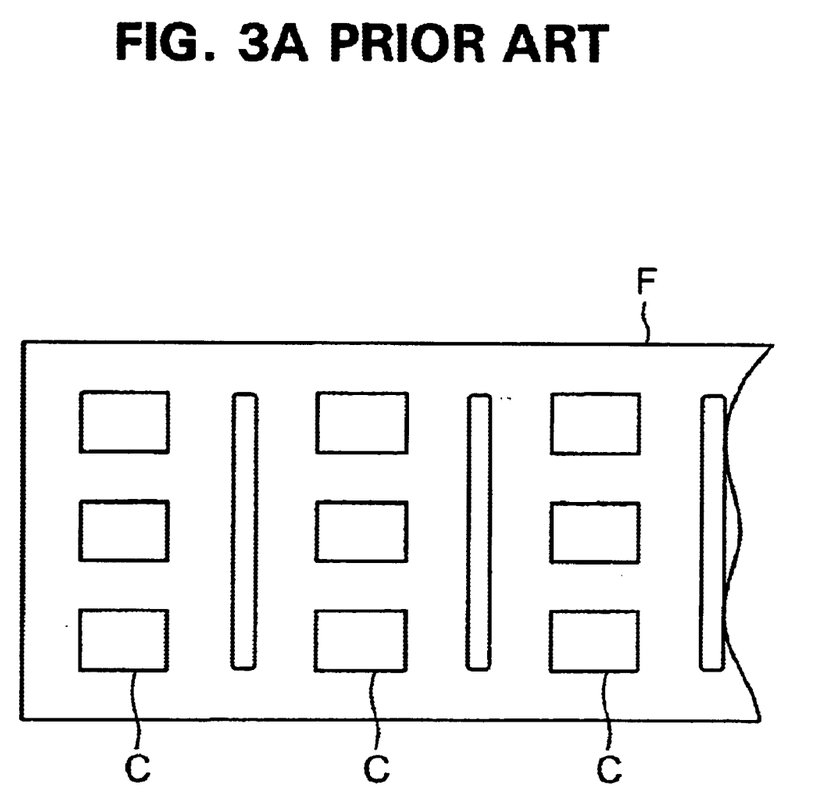
FIGS. 3(A) and (B) are explanatory views of an individually molded type of semiconductor package, FIG. 3 (A) being a partial plan view of a frame with mold cavities and FIG. 3(B) being a side view of each semiconductor package.
Figure 3B:
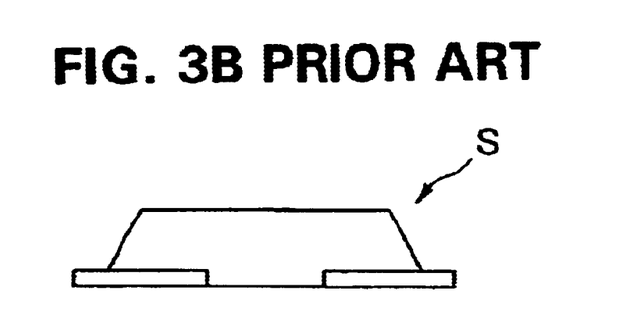

In the frame of the individually molded type, as shown in FIG. 3(A), individual molding cavities C of small size are provided separately within a frame F. After molding, individual semiconductor packages are stamped out so that semiconductor packages S shown in FIG. 3(B) are obtained. Namely, semiconductor devices are mounted on die-pads of lead frames through silver paste and others, and wire bonding is carried out. Thereafter, respective semiconductor devices are individually molded with molding compound and the molded semiconductor devices are stamped out to form individual semiconductor packages.

Figure 4A:
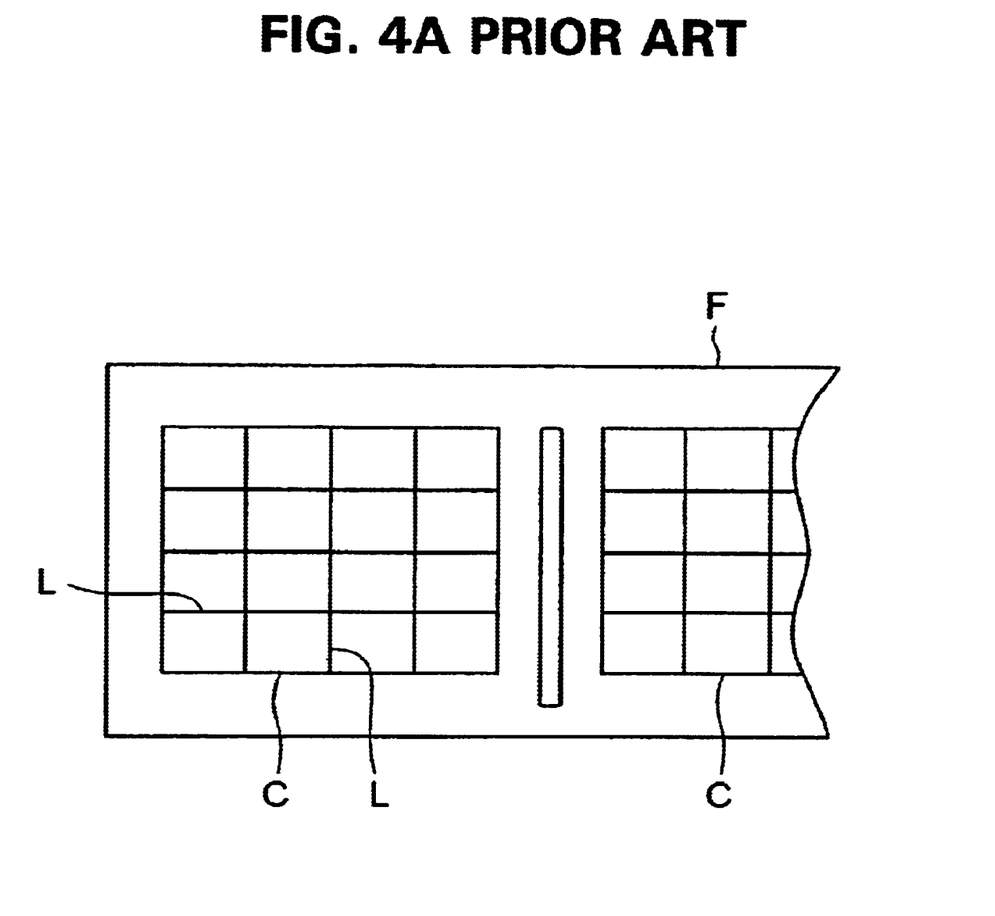
Figure 4B:
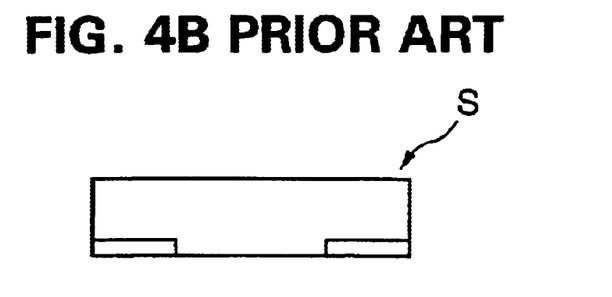

In the frame of the collectively molded type, as shown in FIG. 4(A), some molding cavities C of large size are provided within a frame F. Multiple semiconductor devices are arranged in a matrix within each molding cavity C, and are respectively and collectively molded with molding compound. Thereafter, the collectively molded semiconductor devices are cut at grid-leads L by means of a dicing saw so that a semiconductor package S shown in FIG. 4(B) is obtained. That is, semiconductor devices are mounted on die-pads of lead frames through silver pastes and others and wire bonding is carried out. Thereafter, plural semiconductor devices are collectively molded with molding compound to a given cavity size, and then the collectively molded semiconductor devices are cut to form individual semiconductor packages by dicing.

Generally, in the above-mentioned semiconductor package, in order to facilitate wire bonding in the process of forming the semiconductor package, noble metal plating such as silver plating is previously given to parts of terminals of the lead frame to be wire-bonded. As to the areas of noble plating, in a semiconductor package of such a type that outer leads project from the semiconductor package, there are many standards that the plating areas of noble metal are restricted between a point 0.3 mm away from the ends of the inner leads and the inside of the dam bar. According to the standards, judgment on whether the plating areas of noble metal are good or defective can be easily made by visual observation. On the other hand, in case of the above-mentioned non-lead type of semiconductor package, plating areas are small, wherein the accuracy of plating areas is assured with values measured in the random sampling. Therefore, increased labor is required for the measurement of the size of the plating areas, which increases costs.

Further, the non lead type of semiconductor packages are separated from each other by punching or dicing, wherein there was a problem that peeling is produced between the molding compound and the terminals of the lead frame, since stress is applied to the terminals of the lead frame in separating the semiconductor packages from each other. Further, there was a problem in that the reliability of assembly after mounting the semiconductor package on a printed circuit board is poor.

Further, in the case of giving noble metal plating to parts of the terminals to be wire-bonded according to a method of plating using masking means, there was a problem that leakage of the least amount of plating solution through a mask of the masking means always occurs.

SUMMARY OF THE INVENTION

In order to overcome the above-mentioned problems, the present invention includes a lead frame used for the production of semiconductor packages characterized in that each of terminals to be wire-bonded to electrodes provided on the top surface of semiconductor device mounted on a die-pad has one or two groove(s) for limiting a plating area of noble metal for wire-bonding.

Further, a semiconductor package of the present invention is a non-lead type of semiconductor package comprising a semiconductor device mounted on a die-pad supported by suspending leads of the lead frame, wires electrically connecting electrodes provided on the top surface of the semiconductor device and terminals of the lead frame, and molding compound for encapsulating the outside region of the semiconductor device including wires such that the lower surface and sides of the terminals are exposed, characterized in that each of the terminals of the lead frame has one or two groove(s) for limiting a plating area of noble metal.

BRIEF DESCRIPTION OF THE DRAWINGS

FIGS. 4(A) and (B) are explanatory views of a collectively molded type of semiconductor package, FIG. 4(A) being a frame with mold cavities and FIG. 4(B) being a side view of each semiconductor package.

PREFERRED EMBODIMENT OF THE INVENTION

Referring to the figures, embodiments of the present invention are explained below.

Figure 5:
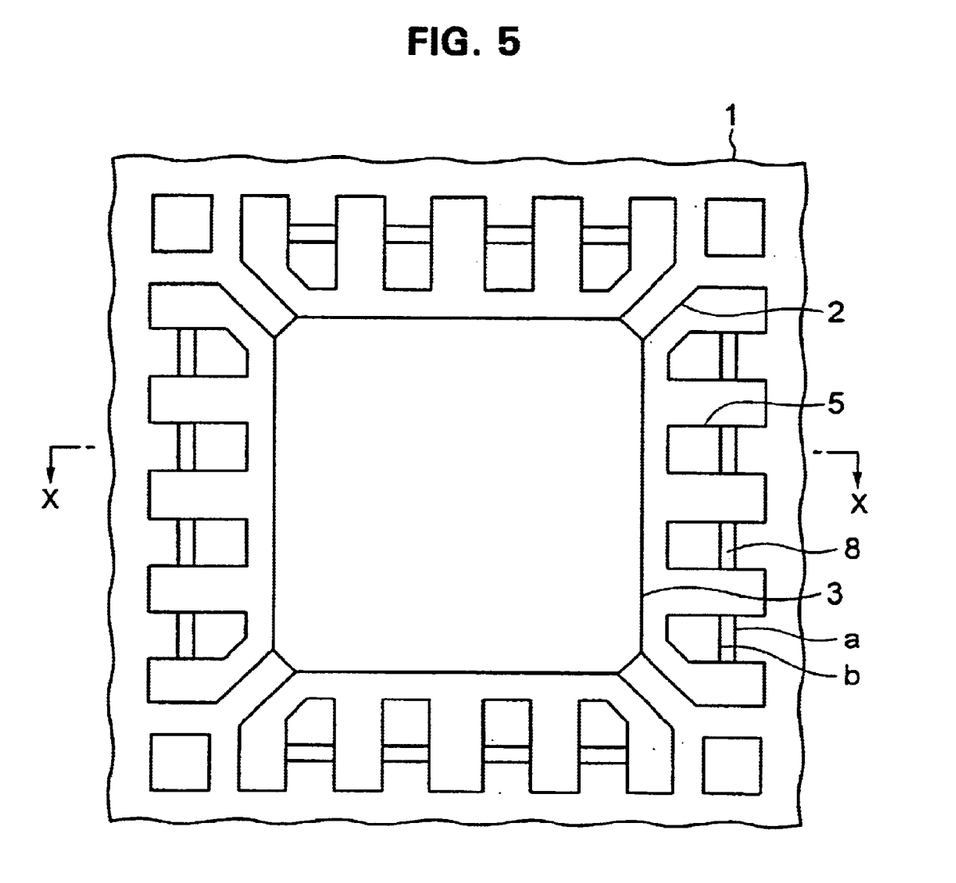
FIG. 5 is a plan view of one example of an individually molded type of semiconductor of the present invention.
Figure 6:
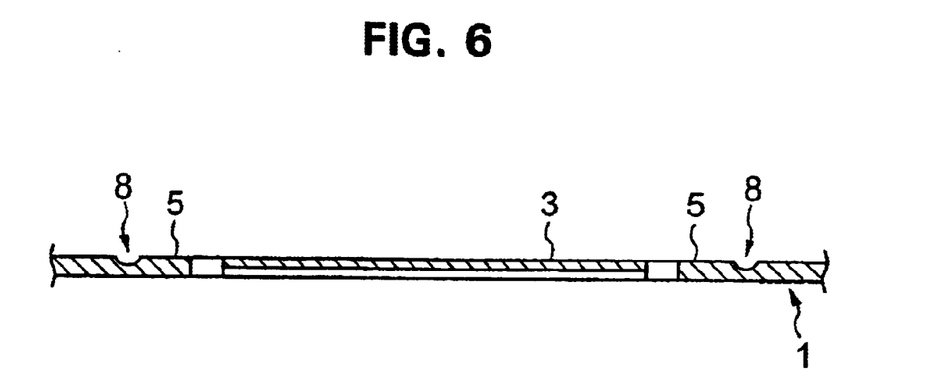
FIG. 6 is a sectional view taken on line X—X of FIG. 5.

Lead frame 1 shown in FIGS. 5 and 6 is used for the production of an individually molded type of semiconductor, wherein a die-pad 3 is supported by four suspending leads 2 and four terminals 5 project from each of four peripheral sides of lead frame toward the die-pad 3, respectively. Each of the terminals 5 has a groove 8 formed by half-etching the front side of terminals 5 at a given distance from the inside of each terminal 5. Further, in the lead frame shown in FIGS. 5 and 6, the backside of die-pad 3 is half-etched so that a thin die-pad is formed.

The lead frame 1 is made of copper sheet with a thickness of 0.2 mm. From a view point of the strength of terminals 5, grooves 8 formed by half-etching have a width of about 0.05 mm to 0.15 mm and a depth of about 25 to 75 percent of the thickness of terminals 5, wherein a groove having a depth of about 0.1 mm is given as a preferable example. In case of an individually molded type of semiconductor package, the lead frames are arranged in a frame in a certain order as shown in FIG. 3(A).

Plating of noble metal such as silver for wire-bonding is given to terminals 5 of lead frame 1, wherein groove(s) 8 formed in each terminal 5 are utilized for limiting an area of the plating of noble metal. Namely, plating of noble metal is given inward from groove 8. In this case, an outside edge "a" of groove 8 limits a maximum area and inside edge "b" limits a minimum area. In the inspection of the plating area of noble metal, if the edge of the plating area of noble metal is positioned in groove 8, the plating area of noble metal passes inspection. The inspection can be made easily by visual observation. The plating area is to be positioned at about 0.3 mm to 0.6 mm from the forward end of terminal 5.

A method of plating terminals 5 with noble metal comprises the steps of applying masking material of resist on the surface of the terminal except on an area to be plated and thereafter plating the area with noble metal. Another method comprises the steps of plating the whole surfaces of the terminals and thereafter electrolytically removing the formed plating film except from an area to be bonded through the masking means. In the latter method, leakage of plating solution can also be prevented by forming the inside of groove 8 into an area able to plated.

The process for producing a semiconductor package using the lead frame 1 after terminals are plated with noble metal is as follows. First, semiconductor device is mounted on a die-pad 3 supported by suspending leads 2 of lead frame 1 through silver paste. Wire bonding between an electrode provided on the top surface of semiconductor device and parts plated with noble metal through gold wire is carried out. Thereafter, lead frames 1 are set in molds so that semiconductor devices with lead frames are individually molded and then semiconductor packages are stamped out individually.

Figure 7:
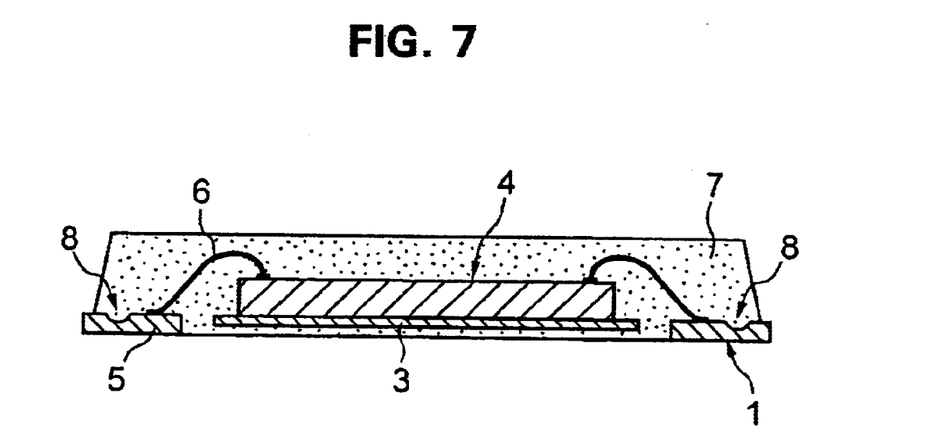
FIG. 7 is a sectional view of a semiconductor package produced using the lead frame shown in FIGS. 5 and 6.

FIG. 7 shows a sectional view of a semiconductor package produced in the above-mentioned process. Each of terminals 5 is formed with groove 8 for limiting a plating area of noble metal. Since molding compound 7 is inserted in the groove 8, the adhesion of terminal 5 to molding compound 7 is improved. Since the backside of semiconductor device 4 is covered with molding compound 7 as shown in FIG. 7, dendrite is prevented from being generated between the backside of the semiconductor device 4 and wires on the printed circuit board under die-pad 3, when mounting semiconductor device on the printed circuit board. Further, die-pad 3 does not come off molding compound 7.

Figure 8:
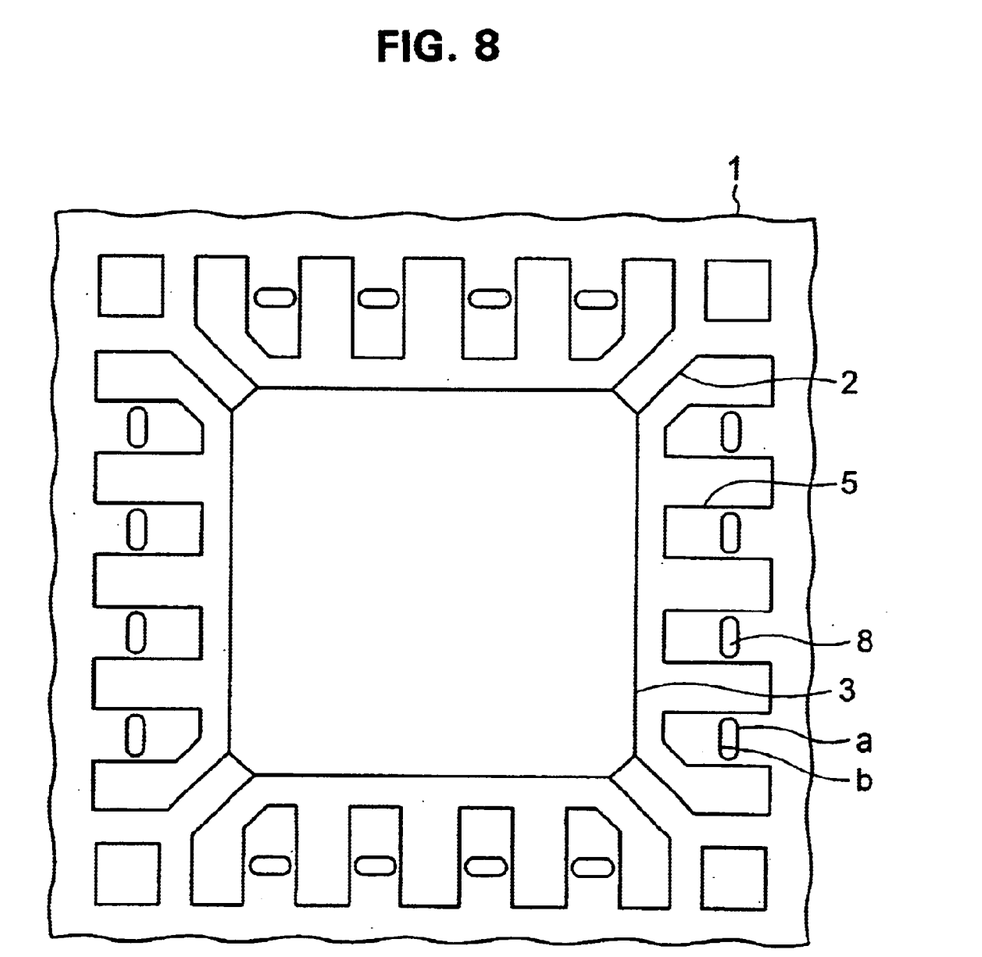
FIG. 8 is a plan view of an alteration of lead frame shown in FIG. 6.
Figure 9:
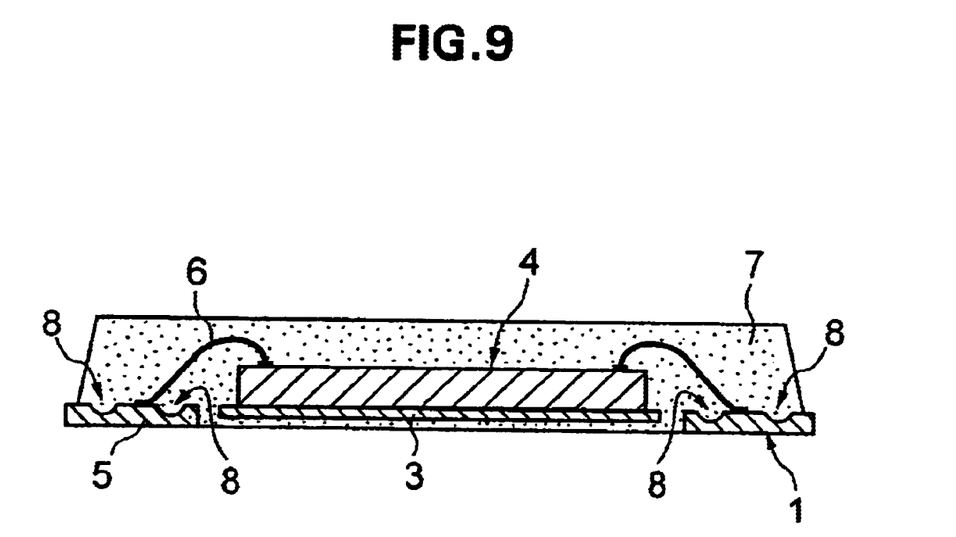
FIG. 9 is a sectional view of an alteration of the semiconductor package shown in FIG. 7.

In the above-mentioned example, grooves 8 are formed such that the grooves cross terminals 5. However, grooves 5 may be formed into such a shape so that non-etched parts exist so as to form banks at both ends of groove 5 in the crosswise direction of terminal 5 as shown in FIG. 8. The groove 8 having banks has an improved strength against bending of terminal 5 as compared with groove 8 with no bank shown in FIG. 5.

In the above description, an individually molded type of semiconductor package of the present invention is explained. However, a collectively molded type of semiconductor can be explained in the same manner.

Since a lead frame according to the present invention is characterized in that each terminal of lead frame is formed with groove(s), the accuracy of the plating area can be easily checked by visual observation. Accordingly, the cut of inspection cost can be carried out.

Further, the grooves absorb stress applied to the terminals when molded semiconductor packages are individually separated from each other by means of punching or dicing. Accordingly, molding compound coming off of the terminals is prevented. Further, since the grooves absorb vibrational stress applied to the terminals after mounting a semiconductor device on the printed circuit board, the reliability of assembly is improved.

Further since molding compound is inserted into present within the grooves of the terminals, the adhesion of the terminals to the molding compound is improved so that it is difficult for moisture to be absorbed between the terminals and the molding compound. Accordingly, the reliability of semiconductor is improved.

Further, when a method comprising the steps of plating the whole surface and thereafter electrolytically removing plating film except at an area to be bonded through the masking means is employed as a method of plating terminals, leakage of plating solution can be also prevented by forming the inside of groove so as to be able to plated so that plating with a high accuracy is become possible.

Although particular preferred embodiments of the invention have been disclosed in detail for illustrative purposes, it will be recognized that variations or modifications of the disclosed apparatus, including the rearrangement of parts, lie within the scope of the present invention.

What is claimed is:

1. A method of making a semiconductor package, said method comprising the steps of:
   providing a lead frame having suspending leads which support a die-pad and terminals, each terminal having an upper surface;
   forming a groove in an upper surface of each of the terminals;
   plating the upper surface of each of the terminals with a noble metal using the groove as a means for limiting a noble metal plating area;
   mounting a semiconductor device on the die-pad;
   wire bonding the terminals to the semiconductor device by mounting first ends of wires to the semiconductor device and mounting second ends of the wires to the respective plated areas of the respective terminals; and
   visually inspecting the accuracy of the location of the plated areas on the terminals using the respective grooves as a guide.

2. A semiconductor package made according to the method of claim 1.

3. The method of claim 1, wherein said step of visually inspecting includes using the grooves as a guide with the grooves defining a maximum outer limit for outward extension of the corresponding plated areas.

4. The method of claim 3 wherein said step of forming includes forming each groove so as to extend transversely across the respective terminal and at a predetermined distance from an inner end thereof.

5. The method of claim 3 wherein said step of forming includes forming each groove so as to extend across the entire transverse width of the respective terminal and at a predetermined distance from an inner end thereof.

6. The method of claim 3 wherein said step of forming includes forming each groove with a pair of spaced-apart side edges and a pair of spaced-apart inner and outer edges, said side edges of each groove extending between the respective inner and outer edges and being spaced inwardly from respective side edges of the terminal such that the groove terminates inwardly of each side edge of the respective terminal.

7. The method of claim 3 further including molding with molding compound the semiconductor device to encapsulate the outer region thereof and the wires.

8. A semiconductor package made according to the method of claim 3.

9. The method of claim 1 wherein:
   said step of forming includes forming each groove so that same extends transversely across the respective terminal and at a predetermined distance from an inner end thereof, and forming each groove so as to have an outer transversely extending edge and an inner transversely extending edge; and
   said step of visually inspecting includes using the outer edge of each groove as a maximum outer limit for outward extension of said plated area and using the inner edge of each groove as a minimum inner limit for outward extension of said plated area.

10. The method of claim 9 wherein said step of visually inspecting includes determining whether an outer extent of the plated area on the terminal is disposed between the inner and outer edges of the respective groove, and if so, then passing the terminal from an inspection standpoint.

11. A method of making a semiconductor package, said method comprising the steps of:
    providing a lead frame having suspending leads which support a die-pad and terminals, each terminal having an upper surface;
    forming one or two grooves in an upper surface of each of the terminals for serving as a boundary for a noble metal plating;
    plating the upper surface of each of the terminals with a noble metal utilizing the grooves as a boundary for the plating;
    mounting a semiconductor device on the die-pad;
    wire-bonding the terminals to the semiconductor device by mounting first ends of wires to the semiconductor device and second ends of the wires to the respective plated areas of the respective terminals; and
    visually inspecting the accuracy of the location of the plated areas on the terminals using the respective grooves to determine whether the plating is acceptable.

12. The method of claim 11, wherein one groove is provided in the upper surface of each of the terminals and an outer edge of the groove serves as a boundary for the plating.

13. The method of claim 11, wherein one groove is provided in the upper surface of each of the terminals and an inner edge of the groove serves as a boundary for the plating.

* * * * *